United States Patent
Imai et al.

(10) Patent No.: US 9,570,268 B2
(45) Date of Patent: Feb. 14, 2017

(54) ELECTRON GUN, CHARGED PARTICLE GUN, AND CHARGED PARTICLE BEAM APPARATUS USING ELECTRON GUN AND CHARGED PARTICLE GUN

(71) Applicant: HITACHI HIGH-TECHNOLOGIES CORPORATION, Minato-ku, Tokyo (JP)

(72) Inventors: Yuta Imai, Tokyo (JP); Takashi Ohshima, Tokyo (JP); Hideo Morishita, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 14/787,263

(22) PCT Filed: Apr. 14, 2014

(86) PCT No.: PCT/JP2014/060575
§ 371 (c)(1),
(2) Date: Oct. 26, 2015

(87) PCT Pub. No.: WO2014/175087
PCT Pub. Date: Oct. 30, 2014

(65) Prior Publication Data
US 2016/0104597 A1    Apr. 14, 2016

(30) Foreign Application Priority Data
Apr. 25, 2013  (JP) .................................. 2013-092484

(51) Int. Cl.
*H01J 29/28*   (2006.01)
*H01J 29/00*   (2006.01)
(Continued)

(52) U.S. Cl.
CPC ............. *H01J 37/073* (2013.01); *H01J 27/02* (2013.01); *H01J 27/26* (2013.01); *H01J 29/481* (2013.01);
(Continued)

(58) Field of Classification Search
USPC .. 250/306, 309, 310, 423 F, 396 ML, 396 R, 250/526
See application file for complete search history.

(56) References Cited

U.S. PATENT DOCUMENTS

| | | | | |
|---|---|---|---|---|
| 8,890,444 B2 * | 11/2014 | Hayn | .................... | H01J 37/063 313/363.1 |
| 2005/0052117 A1 * | 3/2005 | Ozaki | .................... | H01J 29/467 313/497 |

(Continued)

FOREIGN PATENT DOCUMENTS

| | | |
|---|---|---|
| JP | 54-31784 B2 | 10/1979 |
| JP | 55-31986 B2 | 8/1980 |

(Continued)

OTHER PUBLICATIONS

International Search Report from International Patent Application No. PCT/JP2014/060575, Apr. 14, 2014.

*Primary Examiner* — Bernard Souw
(74) *Attorney, Agent, or Firm* — Miles & Stockbridge P.C.

(57) ABSTRACT

The purpose of the present invention is to provide a charged particle gun using merely an electrostatic lens, said charged particle gun being relatively small and having less aberration, and to provide a field emission-type charged particle gun having high luminance even with a high current. This charged particle gun has: a charged particle source; an acceleration electrode that accelerates charged particles emitted from the charged particle source; a control electrode, which is disposed further toward the charged particle source (Continued)

side than the acceleration electrode, and which has a larger aperture diameter than the aperture diameter of the acceleration electrode; and a control unit that controls, on the basis of a potential applied to the acceleration electrode, a potential to be applied to the control electrode.

15 Claims, 16 Drawing Sheets

(51) Int. Cl.
| | |
|---|---|
| H01J 27/02 | (2006.01) |
| H01J 37/073 | (2006.01) |
| H01J 27/26 | (2006.01) |
| H01J 37/063 | (2006.01) |
| H01J 37/08 | (2006.01) |
| H01J 37/28 | (2006.01) |
| H01J 37/06 | (2006.01) |
| H01J 29/48 | (2006.01) |
| H01J 37/145 | (2006.01) |
| H01J 37/20 | (2006.01) |

(52) U.S. Cl.
CPC ............ *H01J 37/06* (2013.01); *H01J 37/063* (2013.01); *H01J 37/08* (2013.01); *H01J 37/145* (2013.01); *H01J 37/20* (2013.01); *H01J 37/28* (2013.01); *H01J 2237/062* (2013.01); *H01J 2237/06341* (2013.01); *H01J 2237/06375* (2013.01); *H01J 2237/0802* (2013.01); *H01J 2237/1508* (2013.01); *H01J 2237/2007* (2013.01); *H01J 2237/2801* (2013.01)

(56) References Cited

U.S. PATENT DOCUMENTS

| | | | |
|---|---|---|---|
| 2010/0320942 A1* | 12/2010 | Hayn | H01J 37/063 315/379 |
| 2012/0062094 A1* | 3/2012 | Ichihashi | H01J 37/063 313/11 |
| 2013/0087703 A1* | 4/2013 | Onishi | H01J 37/065 250/306 |

FOREIGN PATENT DOCUMENTS

| | | |
|---|---|---|
| JP | 63-175323 A | 7/1988 |
| JP | 4-4548 A | 1/1992 |
| JP | 2007-19045 A | 1/2007 |
| JP | 2010-272381 A | 12/2010 |

\* cited by examiner

ELECTRON GUN, CHARGED PARTICLE GUN, AND CHARGED PARTICLE BEAM APPARATUS USING ELECTRON GUN AND CHARGED PARTICLE GUN

TECHNICAL FIELD

The present invention relates to an electron gun and a charged particle gun employed for a charged particle beam apparatus and the charged particle beam apparatus employing the electron gun and the charged particle gun.

BACKGROUND ART

In order to obtain a high resolution electron microscope, it requires that an electron beam with a high current be irradiated onto a sample in such a condition that the beam is focused as small as possible. For that purpose, an electron gun to generate the electron beam is indispensably arranged with a higher luminance.

A Cold (Cathode) Field Emission (CFE) type electron gun is often adopted for a high luminance and high resolution electron microscope, the electron source of which gun is smaller in a light source size and higher in luminance than the other electron sources such as thermo electron emission and Schottky emission. In addition, with such electron gun, the energy spread of drawn electrons is very small. Upon the electron beam being focused with an electron optical system employing an electron lens, a blurring referred to as a chromatic aberration occurs in proportion to the energy spread of the beam. That is to say, the electron source having a smaller energy spread of emitted electrons permits the electron beam to be more finely focused, because it has a smaller chromatic aberration.

Conventionally, when such Cold (Cathode) Field Emission type electron gun is adopted for the electron gun, what employs a Butler electron lens composed of a drawing electrode 21 and an acceleration electrode 22 as shown in FIG. 2 is generally adopted. Hereupon, the Butler electron lens is a kind of electrostatic lens having the structure in which two pieces of circular electrode plates are disposed in parallel to each other on each side with regard to the electron source, in which the outer side of the two disks respectively is planner while the inner side opposed to such outer side is gradually thinned from the outer circumference thereof towards the center direction. An aperture, through which the electron beam passes, is provided between such two disks on each side. The electron lenses whose shapes are somewhat transformed from such two disks are also referred to as Butler electron lenses or Butler type electron lenses. Adopting the structure of such Butler electron lens advantageously allows the structure of the electron gun to be streamlined and the size of such gun to be relatively streamlined.

For the purposes that the aberration of the electron gun is abated and the luminance thereof is improved, such magnetic field superposition type electron gun is contrived as converging the electron beam employing a magnetic field lens in addition to an electrostatic lens, which electron gun is arranged in PTL 1 below by way of one example such that the electron source is disposed within the magnetic field of the magnetic field lens so that the electron beam emitted from the electron source is converged by use of the magnetic field lens whose focal length is short, thereby, allowing the electrostatic lens action to draw electrons from the electron source to be abated, with the result that the high current electron beam is realized with the aberration increase suppressed even when the captured angle of the beam might be enlarged.

CITATION LIST

Patent Literature

PTL 1: Japanese Patent Application Laid-Open No. 2010-272381

SUMMARY OF INVENTION

Technical Problem

In order to realize a high resolution electron microscope and electron beam application device, it requires that an electron gun whose virtual light source diameter of the electron beam is small be employed. Further, for the purpose that an effective small light source diameter is gained with such small virtual light source diameter in use, it requires that the aberration of the electron gun itself be minimized. On account that the aberration of the electron gun employing the conventional Butler type electron lenses is large, upon such gun being applied for an electron microscope, it requires that such aberration be reduced with an electron lens disposed posterior to the electron gun. As a result of it, with the electron gun employing Butler type electron lenses, the luminance of the light source is not put to effective use.

On the other hand, as disclosed in PTL 1, an electron gun with a reduced aberration is realizable with a magnetic field lens concurrently used for the electron gun portion. However, the electrostatic lens and the magnetic field lens being used in combination, the axial alignment of the optical system is must, which deteriorates the operability of the electron gun. Moreover, the structural arrangement of the electron gun becomes complicated so that it cannot help being relatively large-scale in size.

Furthermore, with the electron gun employing the conventional Butler type electron lenses, when a voltage applied to an acceleration electrode is changed, the virtual focal position of the electron beam largely fluctuates. This causes the optical axis to be displaced, so that there are some cases where the irradiation position and size of the electron beam might be changed, with the result that the stability and operability of an electron microscope and an electron beam application device each carrying an electron gun deteriorate.

In view of the foregoing, the present invention is to provide an electron gun (and charged particle gun) that is relatively small in size and whose aberration is minimized.

Solution to Problem

The gist of the representative means to address the problem according to the present invention is described as follows. That is to say, the electron gun according to the present invention includes a needle-like electron source acting as a field emission type electron source; an acceleration electrode to accelerate electrons emitted from the electron source; a control electrode disposed nearer to the side of the electron source than to the side of the acceleration electrode and having a larger aperture diameter than that of the acceleration electrode; and a control section to control a potential applied to the control electrode based on a potential applied to the acceleration electrode.

Further, the charged particle beam apparatus according to the present invention employing the above-mentioned electron gun is characterized in comprising at least one or more pieces of electrostatic lenses or magnetic field lenses; a sample stage on which an observation sample is placed; and a detector to detect at least one of a reflected electron and a secondary electron, in which the sample is observed or analyzed with the electron beam.

On top of that, the charged particle gun according to the present invention includes a charged particle source; an acceleration electrode to accelerate a charged particle emitted from the charged particle source; a control electrode disposed nearer to the side of the charged particle source than to the side of the acceleration electrode and having a larger aperture diameter than that of the acceleration electrode; and a control section to control a potential applied to the control electrode based on a potential applied to the acceleration electrode.

Advantageous Effects of Invention

According to the present charged particle gun, an electric field is generated in the vicinity of the charged particle source in a compacter manner than before. As a result of it, an electrostatic lens short in focal length is generated in the vicinity of the charged particle source.

DESCRIPTION OF EMBODIMENTS

The technical problems, arrangements and advantageous effects other than described above are clarified through the explanations of the following examples. Hereinafter, the mode for carrying out the present invention, its examples and modified examples are explained with reference to the accompanying drawings. To note, throughout the drawings which are referred to herein for explaining the mode for carrying out the present invention, its examples and modified examples, the same structural elements are denoted with the same reference signs, the explanations of which elements are omitted once they are referred to in any one of the drawings.

Figure 16:
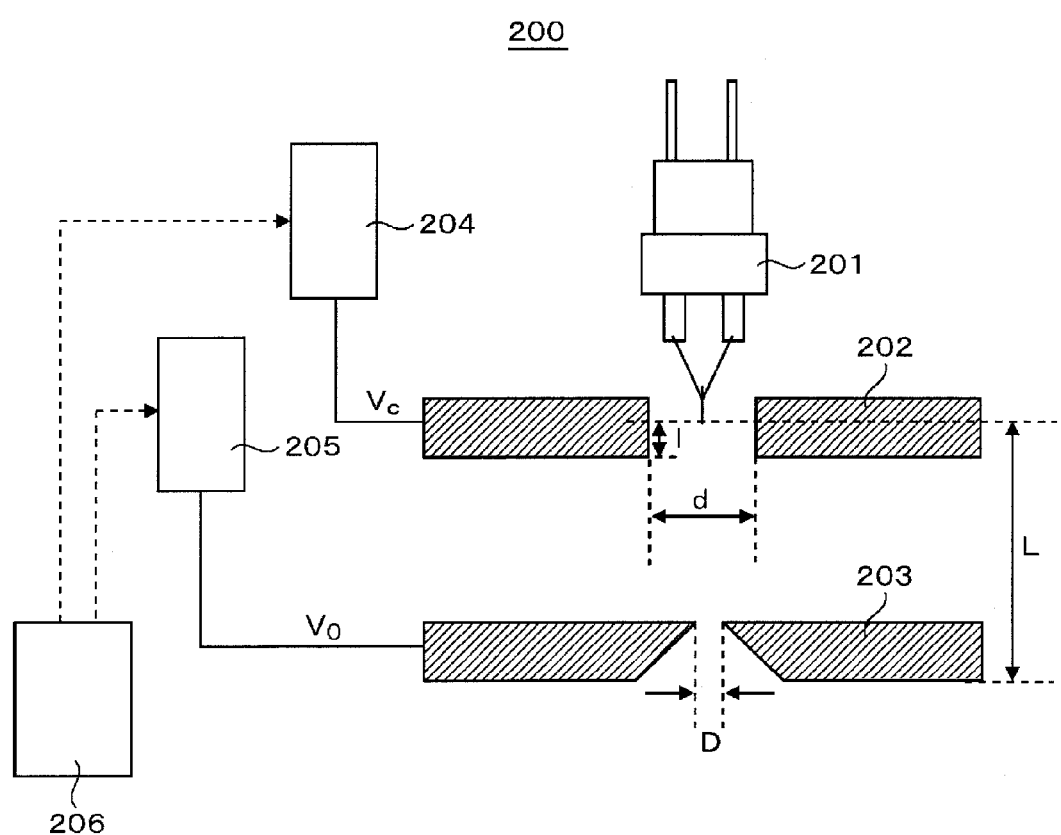
FIG. 16 is a view showing the arrangement of a charged particle gun embodied in the present invention.

FIG. 16 is a view showing the arrangement of a charged particle gun embodied in the present invention. The charged particle gun 200 includes a charged particle source 201; an acceleration electrode 203 to accelerate a charged particle emitted from the charged electron source 201; a control electrode 202 disposed nearer to the side of the charged particle source 201 than to the side of the acceleration electrode 203 and having a larger aperture diameter (d) than that (D) of the acceleration electrode 203; and a control section 206 to control a potential (Vc) applied to the control electrode 202 based on a potential ($V_o$) applied to the acceleration electrode 203.

The control section 206 controls a voltage applied to the control electrode 202 and the acceleration electrode 203 by controlling the power sources 204 and 205.

With the charged particle gun 200, providing that the distance between the charged particle source 201 and the acceleration electrode 203 is defined as L, it is preferred that the ratio of D to L be <1. Further, with the charged particle gun 200, it is preferred that the distance be defined as 6 mm<L<20 mm.

In this regard, the charged particle gun 200 includes a charged particle source 201; an acceleration electrode 203 to accelerate a charged particle emitted from the charged particle source 201; a control electrode 202 disposed nearer to the side of the charged particle source 201 than to the side of the acceleration electrode 203; and a control section 206 to control a potential applied to the control electrode 202 based on a potential applied to the acceleration electrode 203. The control section 206 is arranged such that when an acceleration voltage of the acceleration electrode 203 is low, a control voltage to enhance the electric field at the tip end of the charged particle source 201 is applied to the control electrode 202 whereas when such acceleration voltage is high, a control voltage to suppress the electric field at the tip end of the charged particle source 201 is applied to the control electrode 202.

According to the aforementioned charged particle gun, the electric field is generated in the vicinity of the charged particle source in an extremely compact manner. As a result of it, an electrostatic lens whose focal length is short is generated in the vicinity of the charged particle source, so that the aberration of the gun can be minimized. Further, employing the electrostatic lens whose focal length is short permits the fluctuation of the virtual focal position to be minimized upon the acceleration voltage being changed.

The following examples are centered on the electron gun which generates an electron beam from the electron source, but also applicable to a charged particle gun that generates a charged particle beam from a charged particle source such as an ion source.

Example 1

Arrangement

Figure 1:
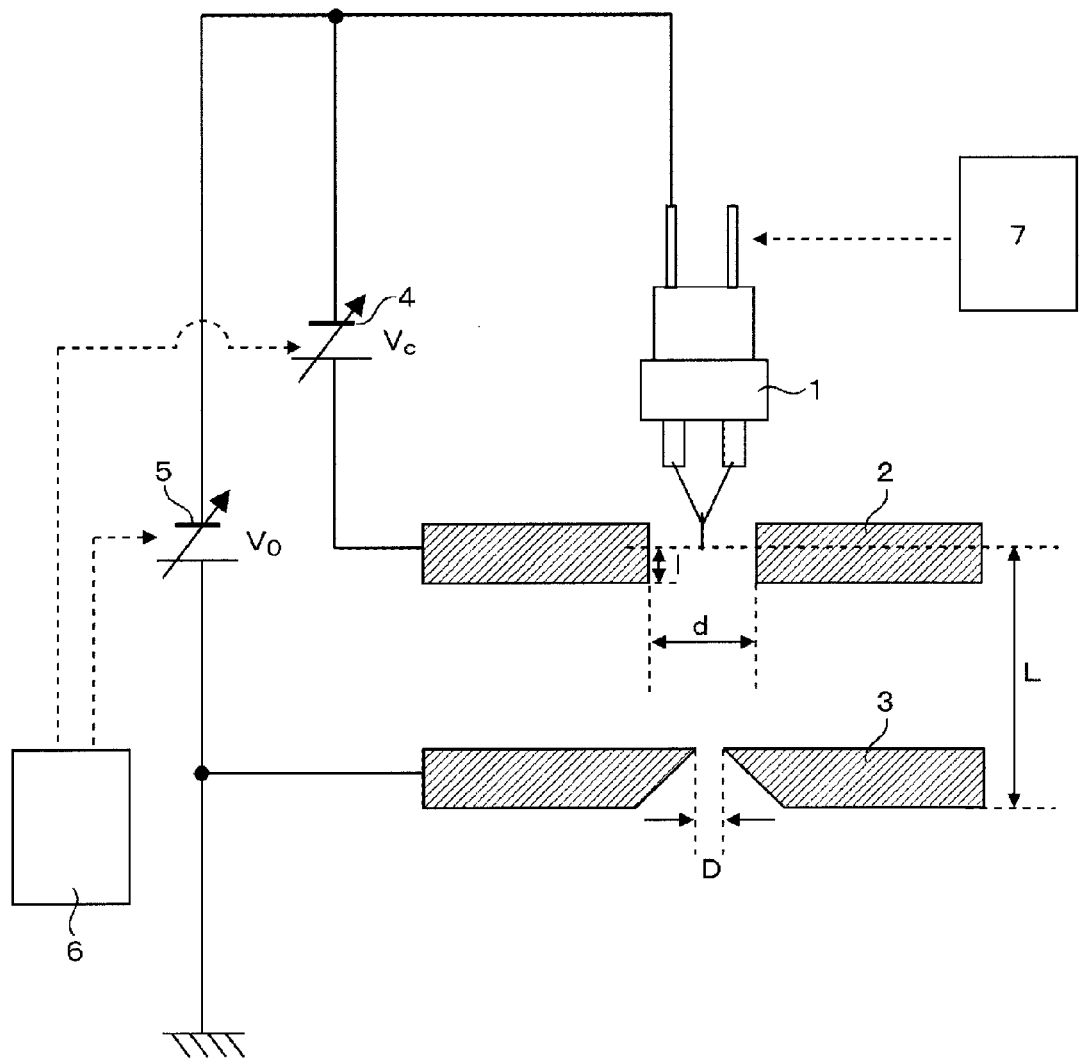
FIG. 1 is a view showing the arrangement of an electron gun according to the first example of the present invention.
Figure 3:
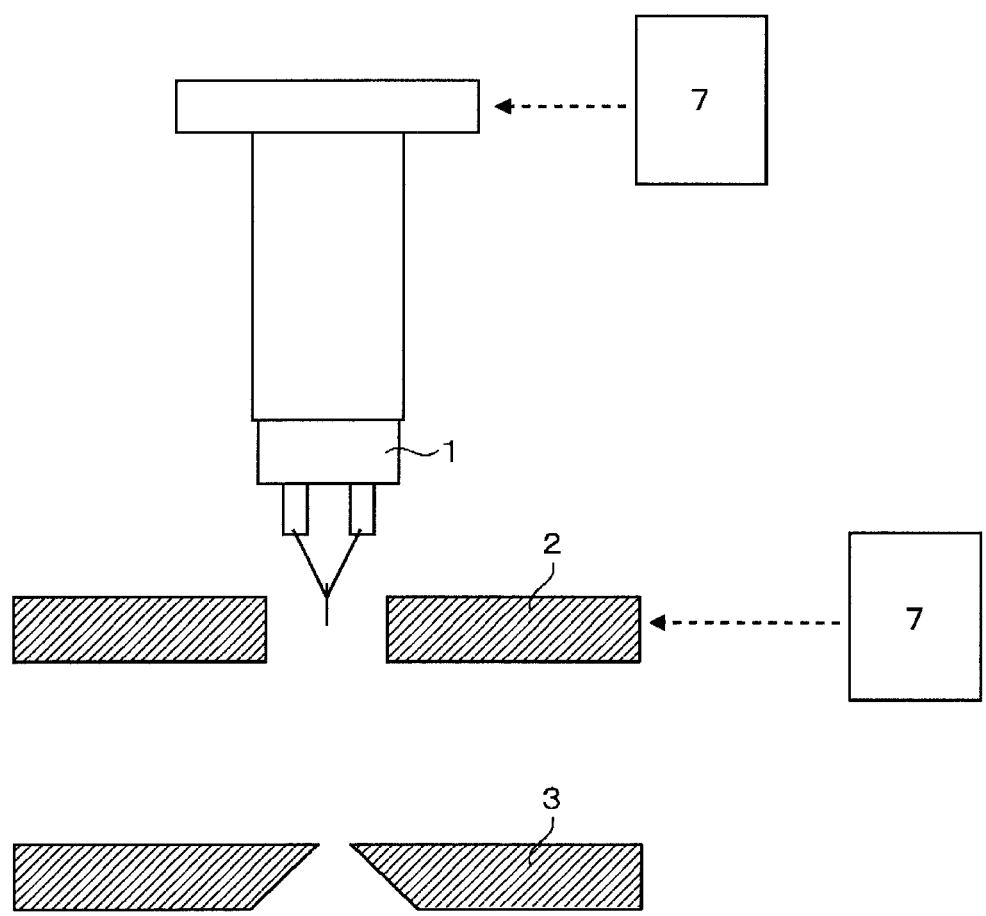
FIG. 3 is a view showing the arrangement of an electron gun according to a first modified example of the present invention.

FIG. 1 is a view showing the arrangement of an electron gun according to the present example. FIG. 3 is a view showing the arrangement of an electron gun according to a first modified example based on the present example. The electron gun 10 according to the present example has an axially symmetrical structure, which is arranged with an electron source 1 placed on the center axis, an acceleration electrode 3 and a control electrode 2 forming an aperture with the axially symmetrically opposed control electrode therebetween. The electron source 1, the control electrode 2 and the acceleration electrode 3 are placed in the vacuum with $10^{-8}$ Pa or higher. The electron source 1, the acceleration electrode 3 and the control electrode 2 are electrically insulated with one another, in which a potential ($V_0$) is applied by an acceleration power source 5 to the electron source 1 with the grounding section defined as a reference. Further, a voltage ($V_c$) is applied to the control electrode 2 by a control electrode power source 4 with the potential ($V_0$) of the electron source 1 defined as a reference. The electron gun 10 further includes a control section 6 to exert control such that a control voltage ($V_c$) in association with an acceleration voltage ($V_0$) is applied. The electron gun 10 further includes a positional adjustment mechanism 7 to adjust the horizontal position of the electron source 1. The electron source 1 is of a Cold (Cathode) Field Emission (CFE) type.

Hereupon, structurally, the control electrode 2 has a larger aperture diameter (d) with the axially opposed counterpart than an aperture diameter (D) of the acceleration electrode 3 with the axially opposed counterpart. The advantage brought by making the aperture diameter (d) larger, among others, lies in the fact that an affect caused by the displacement of the control electrode 2 with regard to the tip end of the electron source 1 can be relatively mitigated, so that the manufacturing and axial adjustment of the electron gun is facilitated. The control electrode 2 is disposed near the tip end (tip end of an emitter) of the electron source 1. It is preferred that the distance (I) from the tip end of the electron source 1 to the lower end of the control electrode 2 be 2 mm or shorter.

The adjustment mechanism 7 to mechanically adjust the horizontal position of the electron source 1 is provided to adjust the axis through which the electron source 1 and electrodes (control electrode 2 and acceleration electrode 3) are aligned with one another. Further, as shown in FIG. 3, with the electron gun 10A, the positional adjustment mechanism 7 may be provided not only on the electron source 1, but also on the control electrode 2 such that the electron source 1 and the control electrode 2 are independently movable.

Figure 4:
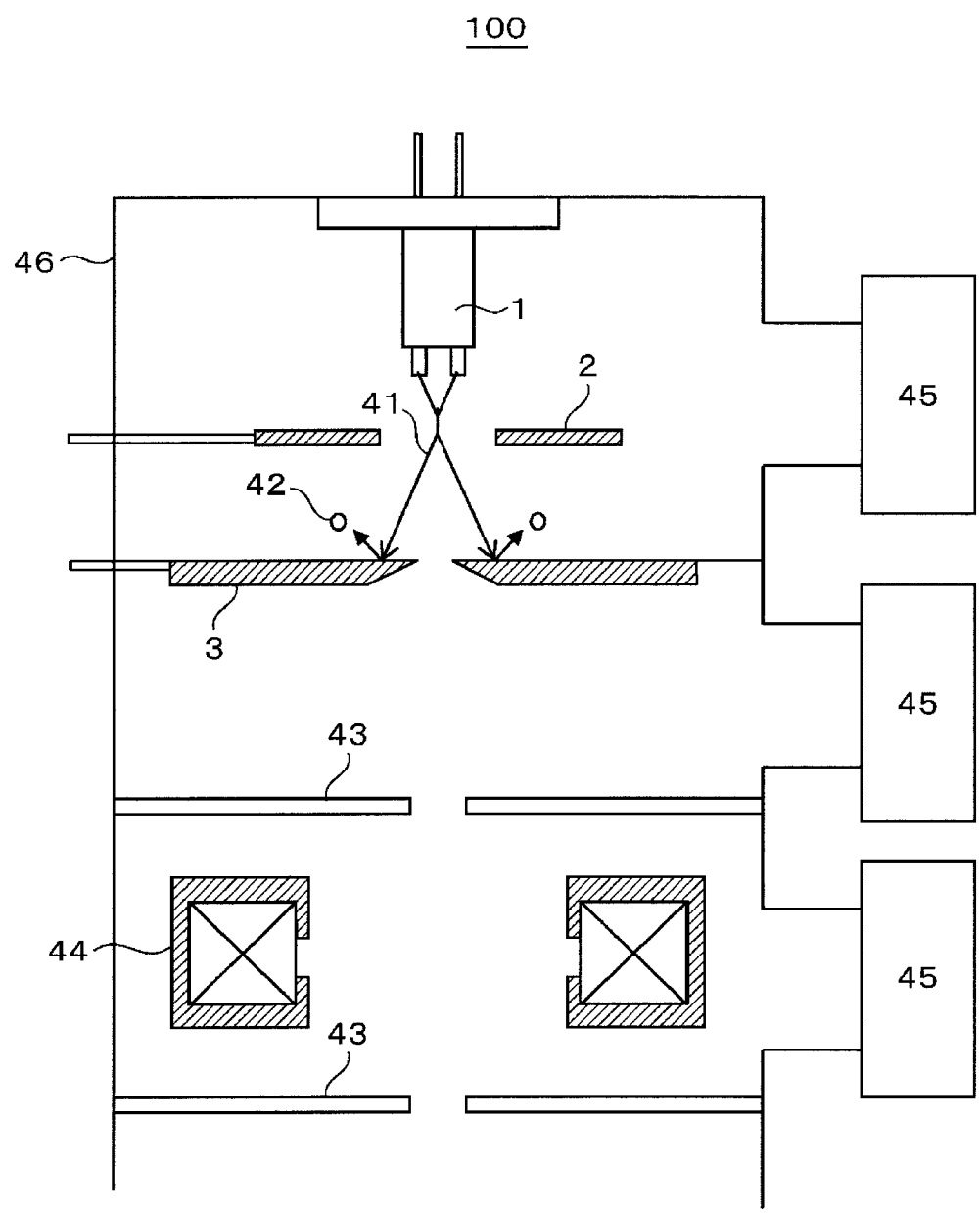
FIG. 4 is a view showing the arrangement of a vacuum exhaust system of an electron microscope carrying the electron gun according to the first example.

FIG. 4 is a view exemplifying the arrangement of a vacuum exhaust system upon the electron gun according to the present example being carried on an electron microscope. The electron microscope 100 includes an electron source 1, a control electrode 2, an acceleration electrode 3 and a condenser lens 44. A high degree of vacuum (high vacuum) of $10^{-8}$ Pa or higher is required for the stable emission of CFE type electron source. In order to realize such high vacuum, as shown in FIG. 4, by way of one example, such differential exhaust structure is employed as several stages of differential exhaust aperture stops 43 being disposed in the housing 46 and the air being exhausted with a vacuum pump 45 per chamber partitioned with such differential exhaust aperture stops 43. In this arrangement, enlarging an aperture formed between the axially symmetrically opposed control electrodes 2 permits the exhaust conductance in the vicinity of the tip end of the electron source 1 to be enhanced so as to facilitate the air in the vicinity of the tip end of the electron source 1 to be exhausted with such vacuum pump 45. As a result of it, advantageously, a reachable degree of vacuum in the vicinity of the electron source 1 increases so as to make current stability improve. Moreover, the enhanced exhaust conductance allows a degree of vacuum sufficient for the field emission to be gained just with a smaller-scale vacuum pump, with the result that the vacuum exhaust system as a whole is advantageously streamlined in size.

In addition, as shown in FIG. 4, when the electron beam 41 drawn from the electron source 1 impinges on the electrodes (control electrode 2 and acceleration electrode 3), an electron impingement degassing 42 occurs. Such electron impingement degassing 42 makes a degree of vacuum in the vicinity of the electron source 1 lowered so as to cause current stability to be deteriorated. Enlarging the aperture between the axially symmetrically opposed control electrodes 2 like the present example brings the advantage with which the impingement of electrons on the control electrode 2 is avoided, with the result that the deterioration of a degree of vacuum in the vicinity of the electron source 1 is prevented.

The electron impingement degassing 42 occurs on the acceleration electrode 3 by the electron beam 41 drawn from the electron source 1 impinging thereon, so that a degree of vacuum in the vicinity of the electron gun (electron source 1, control electrode 2 and acceleration electrode 3) is deteriorated so as to make the stability of the field emission lowered. To prevent such drawback, the acceleration electrode 3 may be provided with a heating mechanism such that it is subjected to thermal degassing before being put to use. In turn, the acceleration electrode 3 may be coated with a material hard to be degassed.

(Principle)

Here, to begin with, the principle based on which the electron beam 41 is generated from the electron source 1 according to the present example is explained. By way of one example, an acutely tipped needle-like W (tungsten) metal is typically adopted for a material of the electron source 1 of the field emission type electron gun. In order to extract electrons from the electron source 1 through field emission, it requires that an electric field of adequate intensity (e.g., in the order of 4V/nm in the case of W metal being adopted for the material of the electron source) be generated at the tip end of the electron source 1.

In order to gain the electron beam 41 with an energy $_eV$ as desired from the electron gun 10 according to the present example, a voltage ($V_0$) to satisfy the equation $V_0=V$ is applied between the acceleration electrode 3 and the electron source 1. At this time, on account that the distance between the acceleration electrode 3 and the electron source 1 is short, an electric field according to the voltage ($V_0$) is generated at the tip end of the electron source 1.

When the acceleration voltage ($V_0$) is low, the tip end of the electron source 1 is in short of an electric field intensity required for extracting electrons. Thus, an electric field intensity optimum for extracting them is secured by applying the control voltage ($V_c$) of positive voltage to the control electrode 2. On the other hand, when the acceleration voltage ($V_0$) is high, it results in an excessive electric field being applied at the tip end of the electron source 1. In order to suppress such excessive electric field, the control voltage ($V_c$) of negative voltage is applied to the control electrode, by which an electric field applied at the tip end of the electron source 1 is controlled within an optimum value. That is to say, the control electrode 2 plays the role of controlling an electric field applied at the tip end of the electron source 1 so as to secure an electric field intensity optimum for extracting electrons. For this reason, it is preferred that the control electrodes 2 having a wide aperture between them be disposed at a position near the tip end of the electron source 1 (<2 mm).

Figure 5:
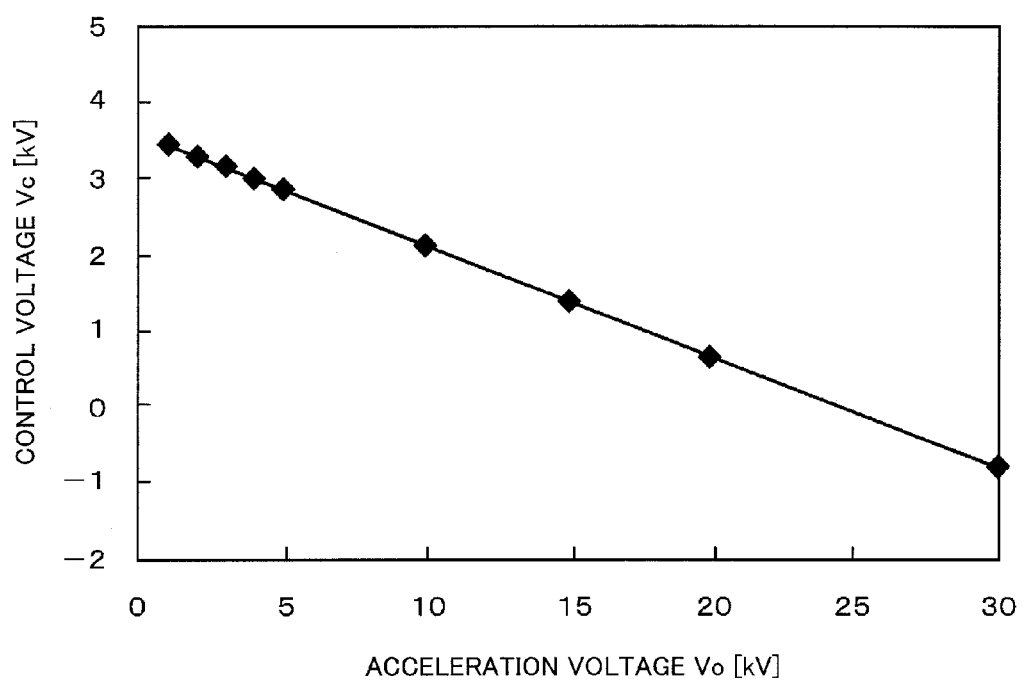
FIG. 5 is a graph showing the relationship between an acceleration voltage and a control voltage of the electron gun according to the first example.

FIG. 5 is a graph showing the relationship between the acceleration voltage and the control voltage of the electron gun according to the present example. FIG. 5 illustrates the control voltage $V_c$ required for generating an electric field of 4V/nm at the tip end of the electron source 1 against the acceleration voltage ($V_0$) provided that the aperture diameter (d) between the control electrodes 2 is 8 mm; the distance (I) between the lower end of the control electrode 2 and the tip end of the electron source 1 is 1 mm; and the distance (L) between the electron source 1 and the acceleration electrode 3 is 10 mm.

As shown in FIG. 5, it is controlled by the control section 6 such that the control voltage ($V_c$) according to the acceleration voltage ($V_0$) is applied. At this time, the control voltage ($V_c$) is the function for the aperture diameter (d) between the control electrodes 2, the distance (L) between the electron source 1 and the acceleration electrode 3 and the distance (I) between the electron source 1 and the control electrode 2. Alternatively, in order to vary the quantity of the drawn electrons, the control voltage ($V_c$) may be varied in practice use.

(Aberration of Electron Gun)

Figure 2:
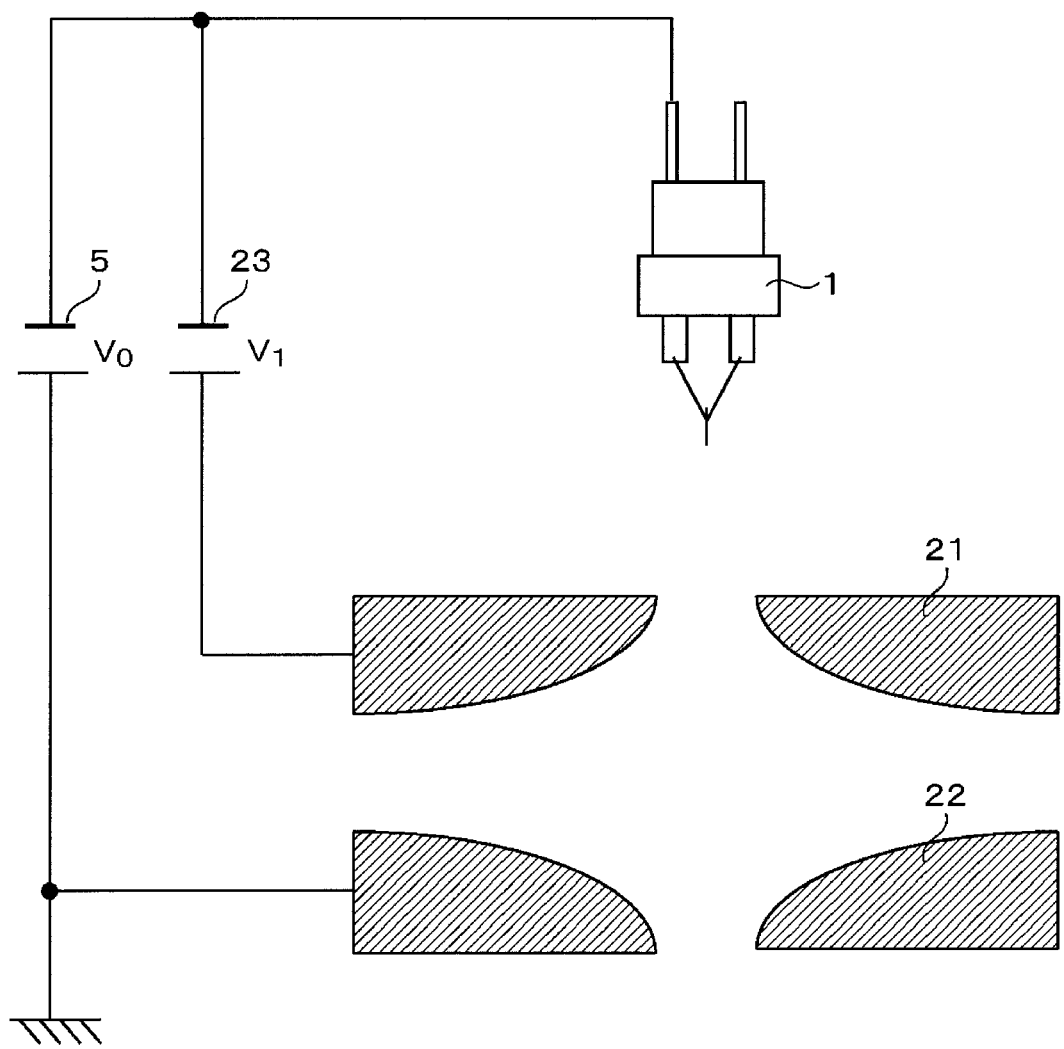
FIG. 2 is a view showing the arrangement of the Butler lens type electron gun according to the prior art.
Figure 6:
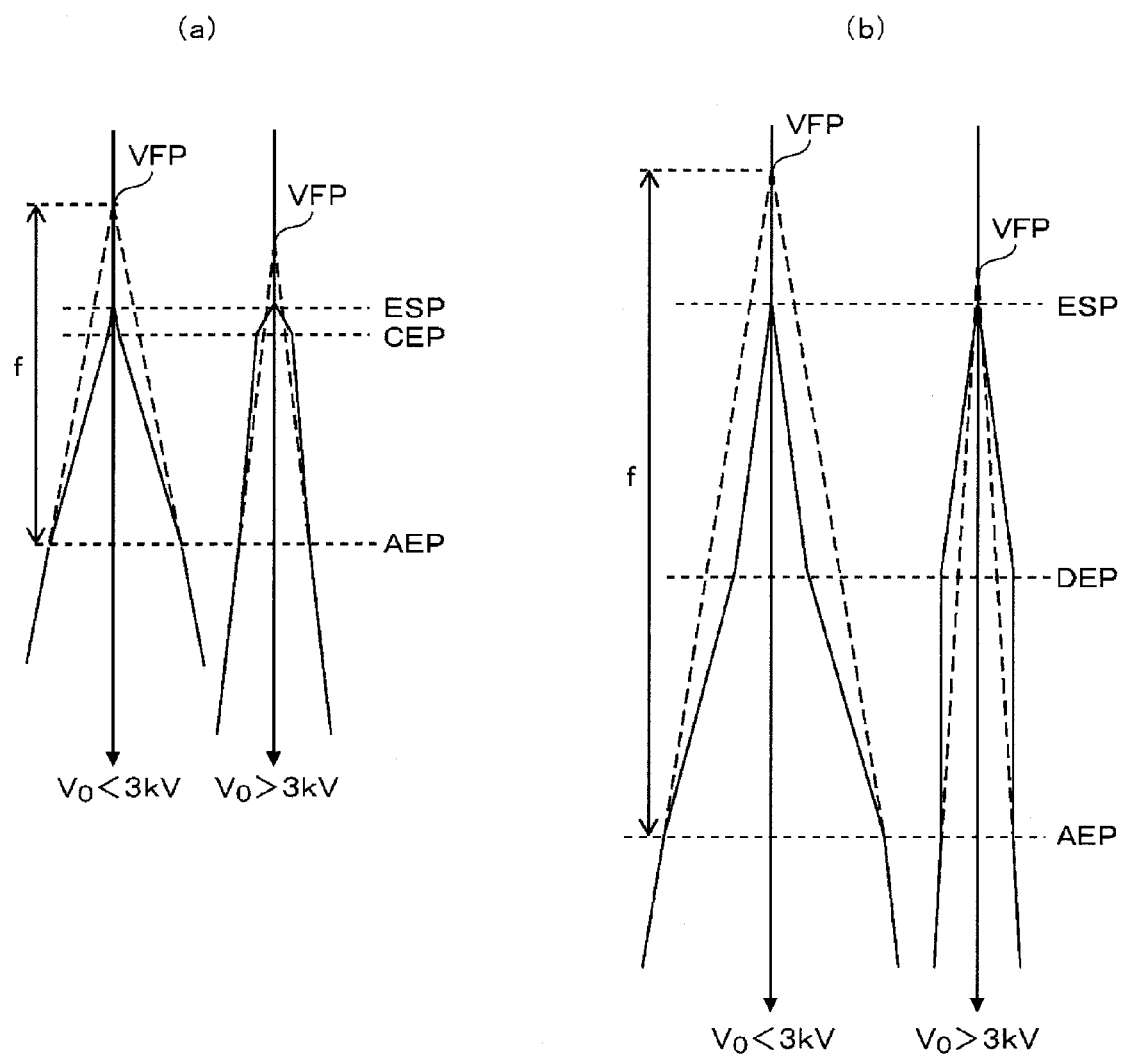
FIG. 6 shows views illustrating electron trajectories drawn by the electron gun.

Then, the aberration of the electron gun according to the present example is explained. FIG. 6 shows views illustrating electron trajectories drawn by the electron gun. The electron trajectory of the electron gun according to the present example is shown in FIG. 6(a) while that according to the conventional Butler lens type electron gun is shown in FIG. 6(b). Here, what is herein referred to as the conventional Butler lens type electron gun is an electron gun 20 shown in FIG. 2. As shown in FIGS. 6(a) and 6(b), after the electrons are emitted from the electron source position (ESP), they are subjected to the electrostatic lens action at the control electrode position (CEP), the drawing electrode position (DEP) and the acceleration electrode position (AEP) so that their trajectory is bent. In the case of such a low acceleration as being defined as $V_0$<3 kV, the electrons drawn from the electron source 1 are bent to the direction away from the optical axis at the position of the electrode (control electrode 2 or drawing electrode 21) nearest to the electron source 1 and bent to the direction approaching the optical axis at the acceleration electrode position (AEP). On the other hand, in the case of such a high acceleration as being defined as $V_0$>3 kV, the electron beam 41 is bent to the direction approaching the optical axis at the position of the electrode (control electrode 2 or drawing electrode 21), nearest to the electron source 1 and bent to the direction away from the optical axis at the acceleration electrode, position (MN. After the acceleration electrode-position (AEP), the electron trajectory becomes straight and the point where the straight trajectory is extrapolated to the side of the electron source 1 and intersects with the optical axis is referred to as a virtual focal position. The focal length of the electrostatic lens of the electron guns 10 and 20 respectively is indicated with f.

With the electron gun 10 according to the present example, the distance between the electron source 1 and the electrode (acceleration electrode 3) to determine the energy of the electron beam 41 is made shorter than that of the conventional Butler lens type electron gun (electron gun in public domain). For instance, with the electron gun 20 in public domain, the distance between the electron source 1 and the acceleration electrode 22 to determine the energy of the electron beam 41 is in the order of 30 mm or shorter whereas with the electron gun 10 according to the present example the distance between the electron source 1 and the acceleration electrode 3 ranges from 6 to 20 mm. This permits the focal length (f) of the electrostatic lens formed by the electrodes of the electron gun 10 according to the present example to be made shorter by one severalth in comparison with that of the electron gun 20 in public domain. Electro-optically speaking, the shorter the focal length becomes, the smaller the aberration becomes.

Figure 7:
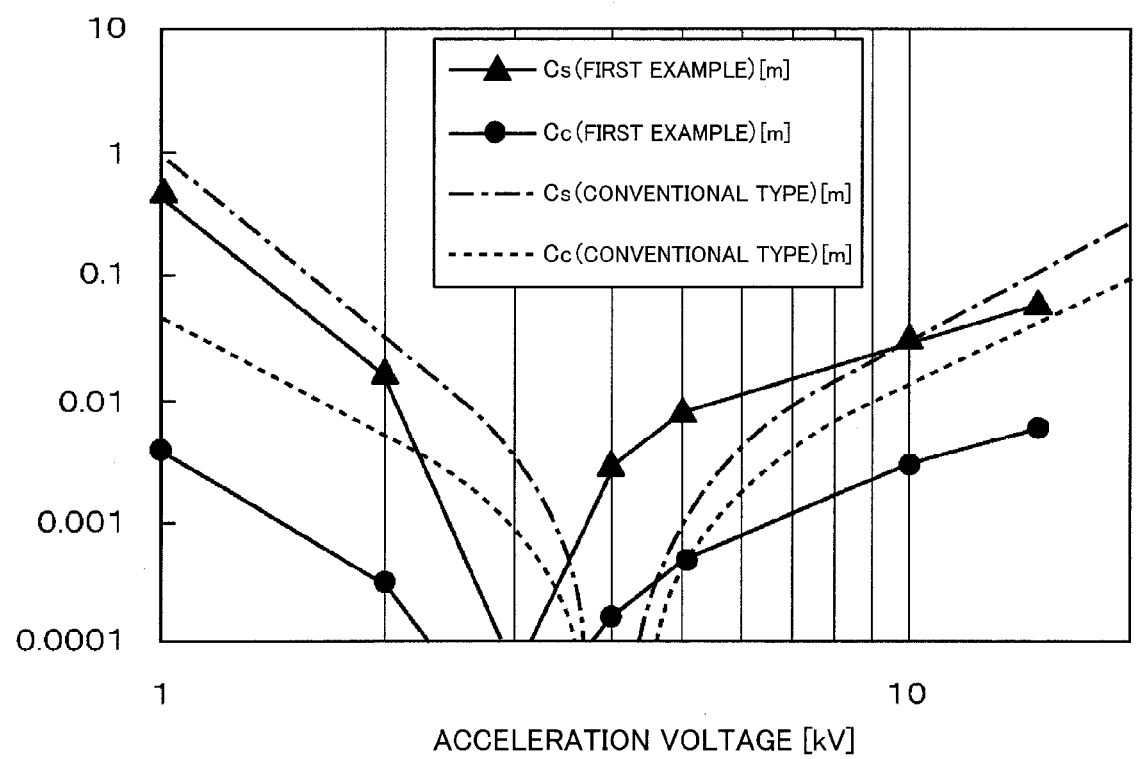
FIG. 7 shows a graph illustrating a theoretical analysis result of the aberration coefficients according to the electron gun according to the first example and the conventional Butler lens type electron gun.

FIG. 7 shows a graph relatively illustrating a theoretical analysis result of the aberration coefficients according to the electron gun assuming a certain shape according to the present example and the electron gun in public domain. The transversal axis of the graph is scaled with the acceleration voltage while the vertical axis thereof is scaled with a spherical aberration coefficient (Cs) and a chromatic aberration coefficient (Cc). In FIG. 7, the electron gun according to the present example is denoted with 'First Example' while that in public domain is denoted with 'Conventional Type'. The chromatic aberration coefficient of the electron gun 10 according to the present example is smaller about by one digit than that of the electron gun 20 in public domain when the electron beam with a lower acceleration of 3 kV or lower, by way of one example. This is due to the fact that the electron lens whose focal length is shorter than that of the conventional one is formed in the vicinity of the electron source.

In order to gain a high resolution image through an electron microscope, it requires that the electron beam be focused as finely as possible so as to be irradiated onto a sample. The chromatic aberration which is one of the factors to cause blurring of the electron beam is in proportion to achromatic aberration coefficient and in disproportion to an acceleration voltage. In other words, in the case where observation is carried out with a lower acceleration voltage, the affect of the chromatic aberration comes to the surface so as to blur the electron beam, with the result that adverse effect is given to the resolution of the microscope. In turn, in proportion to the captured angle of current, the chromatic aberration increases. In order to secure a large quantity of current from the electron gun, what we only have to do is to enlarge the captured angle, but when the aberration coefficient of the electron gun is larger, the aberration of the gun also becomes large to an extent that it cannot be ignored, with the result that the effective luminance thereof largely deteriorates.

On account that the chromatic aberration of the electron gun according to the present example can be made smaller than that of the electron gun in public domain, the blurring of the electron beam is minimized even under a lower acceleration so that such adverse effect can be suppressed.

This permits a high resolution observation to be realized with an electron microscope carrying the electron gun according to the present example even when it might be carried out under a lower acceleration voltage, for instance, when it is carried out under 0.1 to 3 kV of the acceleration voltage. Further, the aberrations (spherical aberration and chromatic aberration) of the electron gun are small, so that a quantity of current can be augmented with the captured angle enlarged and the luminance kept intact. This allows high current to be secured where necessary, which brings the advantage with which the analytical performance of an analysis apparatus utilizing the electron beam such as a spectrometer according to EDX (Energy Dispersive X-ray spectrometry) by way one example improves.

(Virtual Focal Position)

Figure 8:
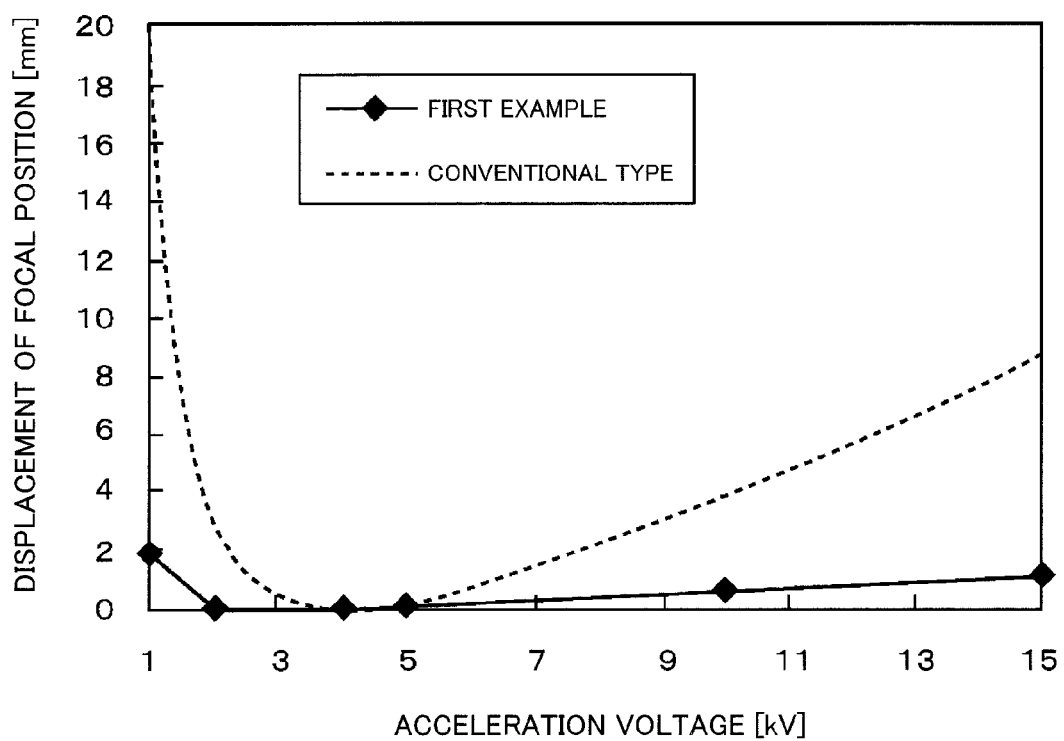
FIG. 8 shows a graph illustrating a theoretical analysis result of the virtual focal position upon the electron beam at an arbitrary acceleration voltage being gained according to the electron gun of the first example and the conventional Butler lens type electron gun.

Next, the fluctuation of the virtual focal position of the electron beam against the change of the acceleration voltage according to the present example is explained. As illustrated in FIG. 6, according as the acceleration voltage $V_0$ changes, the virtual focal position (VFP) fluctuates. FIG. 8 shows a graph relatively illustrating a theoretical analysis result of the virtual focal position (VFP) upon the electron beam at an arbitrary acceleration voltage being gained according to the electron gun of the present example, which assumes a certain shape and the conventional Butler lens type electron gun. The transversal axis of the graph is scaled with an acceleration voltage while the vertical axis thereof is scaled with the distance with the virtual focus position with the tip end position of the electron source 1 defined as a reference position. In FIG. 8, the electron gun according to the present example is denoted with 'First Example' while that according to the public domain is denoted with 'Conventional Type'. With the electron gun 10 according to the present example, the fluctuation of the virtual focal position (VFP) by the acceleration voltage is made smaller about by one digit than that of the electron gun 20 in public domain. This is due to the fact that the distance between the electron source 1 and the acceleration electrode 3 of the electron gun 10 is shortened further than that of the electron gun 20 in public domain, so that as exemplified in FIG. 6, an electron lens shorter in focal length (f) than that of the conventional one is formed in the vicinity of the electron source 1. This allows an axial displacement caused upon an acceleration voltage being changed to be minimized when the electron gun according to the present example is carried on an electron beam apparatus such as SEM (Scanning Electron Microscope), with the result that the operability and stability thereof is enhanced.

In order to secure a favorable result, it requires that the focal length (f) of the electrostatic lens formed by the electrodes be short. The nearer the control electrode position (CEP) is placed to the acceleration electrode 3 than to the tip end of the electron source 1, the longer the focal length (f) of the electrostatic lens and the larger the aberration coefficient become. Further, the longer the distance (I) between the tip end of the electron source 1 and the control electrode 2 becomes, the larger the absolute value of the control voltage ($V_c$) required for controlling the electric field at the tip end of the electron source 1 becomes.

Taking it into considerations that the aberration of the electron gun is further reduced than that of the electron gun 20 in public domain and a practical high-voltage power source is employed, it is preferred that the vertical position of the lower end of the control electrode 2 be in the order of −5 to +3 mm and it is more preferable that such position range from −3 to +2 mm when the tip end of the electron source 1 is defined as the origin and the perpendicularly downward direction is defined as a plus direction. The representative value for the distance between the tip end of the electron source 1 and the lower end of the control electrode 2 is in the order of 1 mm. This is because provided that the distance (L) between the electron source 1 and the acceleration electrode 3 is defined as 10 mm and the aperture diameter (d) between the control electrodes 2 is defined as 8 mm, it results that the required control voltage ranges from 0 to 5 kV when the acceleration voltage of 20 kV or lower is applied in practical use, which allows the electric field to be controlled with one generally and frequently employed high-voltage power source.

Here, it is preferred that the relational distance (L) between the acceleration electrode 3 and the electron source 1 be defined substantially as d/L<1. This is due to the fact that the further the acceleration electrode 3 which concurrently plays the role of drawing electrons approaches the electron source 1, the lower the control voltage $V_c$ required for controlling the electric field at the tip end of the electron source 1 becomes as well as the larger the aperture diameter (d) becomes, the higher the control voltage ($V_c$) required for controlling the electric field at the tip end of the electron source 1 becomes.

Moreover, the distance (L) between the electron source 1 and the acceleration electrode 3 depends on the value of the acceleration voltage ($V_0$) in use and the withstand voltage of the electrode. For example, when the electron beam of 30 kV is required, it requires that the distance (L) be 0.5 mm or longer with the thickness of the electrode taken into account, assuming that the withstand voltage under vacuum is 10 kV/mm.

In the present example, a disk-like electrode whose inner side is cylindrically shaped is exemplified, but the same effect is essentially brought even with modified shapes adopted for the same and just with an electric field applied to the tip end of the emitter, so that the shape of the electrode may be somewhat modified from the exemplified shape, which includes the shape in which the edges of the electrode is smoothly finished or that in which a tapered shape is provided on the inner side of the control electrode.

The W metal is adopted for a material of the electron source 1 in the present example, but even applying for the electron source what is small in the light source diameter or in the virtual light source diameter of the field emission source brings the same effect as allowing the electron beam to be generated without the detrimental of such small light source diameter, since the chromatic aberration and the spherical aberration can be reduced. However, an electric field intensity required for the field emission differs according to the type of the electron source, so that the relationship between the control voltage ($V_c$) and the acceleration voltage ($V_0$) changes as illustrated in FIG. 5. Thus, there is an effective range selectable in view of such relationship according to the type of the electron source in use. As the field emission type electron source whose light source diameter is small, a carbon nanotube and lanthanum hexaboride ($LaB_6$) are exemplified herein.

Second Modified Example

Figure 9:
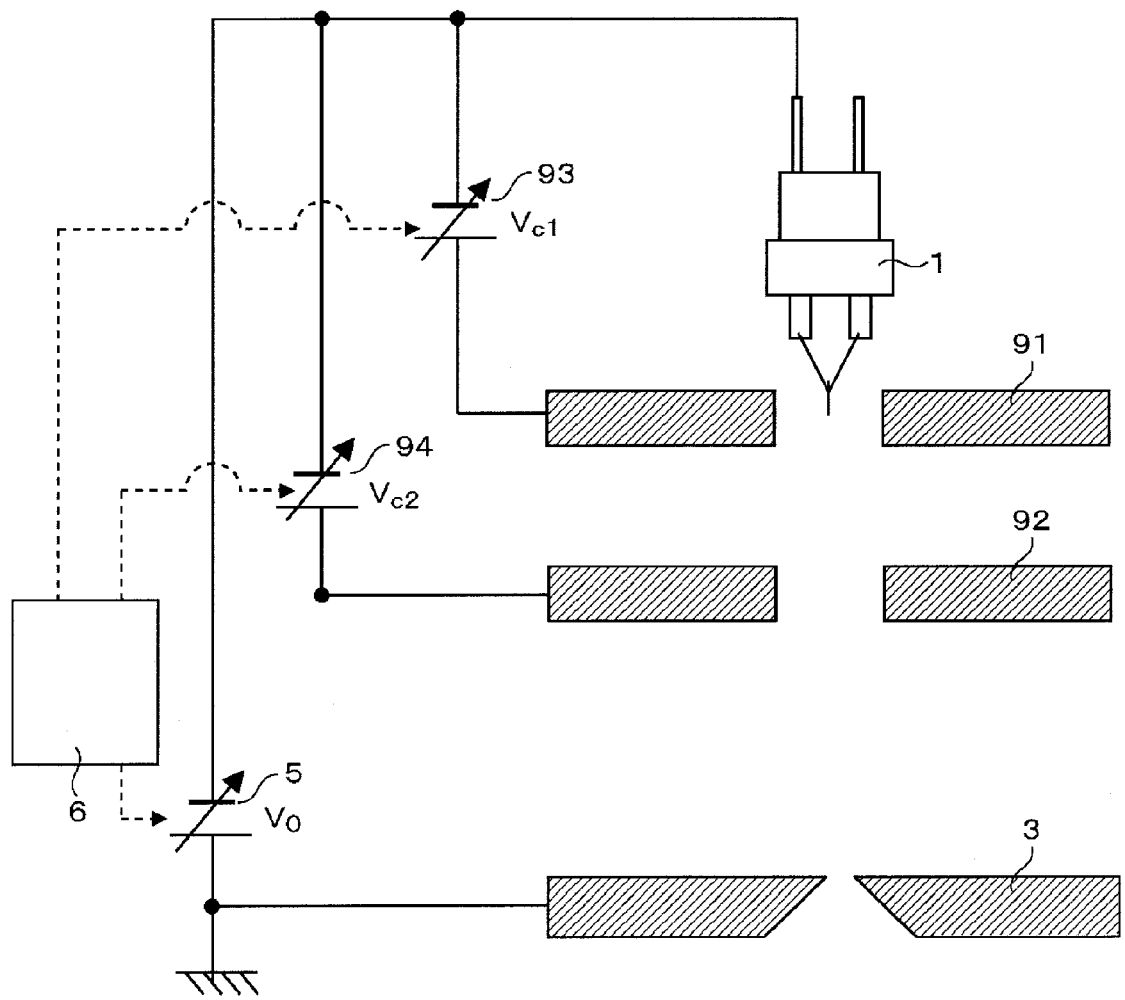
FIG. 9 is a view showing the arrangement of the electron gun according to a second modified example of the present invention.

FIG. 9 is a view showing the arrangement of the electron gun according to the present modified example. In general speaking, the aberration of the electrostatic lens increases in proportion to the intensity of the lens action. In the case of the electron gun 10 according to the first example, when the equation $V_0 = V_c$ is satisfied, the lens action at the electrodes section goes lost so that the aberration becomes 0 and the farther a value derived from the fraction $V_0/V_c$ from 1 becomes, the larger the lens action becomes, with the result that the aberration increases. The control voltage ($V_c$) required for controlling the electric field at the tip end of the electron source 1 against the acceleration voltage ($V=V_0$) as desired depends on the distance between the tip end of the electron source 1 and the control electrode 2, in which the farther such distance becomes, the larger the control voltage $V_c$ required for controlling such electric field becomes. Thus, with the electron gun 10B according to the present modified example, a multiple stage of control electrodes are disposed and it is controlled by the control section 6 such that the control electrode whose aberration is the smallest (a value derived from the fraction $V_0/V_c$ becoming near 1) among the plurality of control electrodes against the acceleration voltage as desired is selected. This allows the aberration to be further minimized within a wider range of the acceleration voltages.

For instance, when two pieces of control electrodes are disposed as illustrated in FIG. 9 and used under the operation of a lower acceleration voltage, the electric field at the tip end of the electron source 1 is controlled with a voltage ($V_{c1}$) applied to the first control electrode 91 through the first control electrode power source 93. On the other hand, when they are used under the operation of a higher acceleration voltage, the electron source 1 and the first control electrode 91 are placed into the same potential and the electric field at the tip end of the electron source 1 is controlled with a voltage ($V_{c2}$) applied to the second control electrode 92 through the second control electrode power source 94. The control section '6 controls the first control electrode power source 93, the second control electrode power source 94 and the acceleration power source 5. This allows the electrostatic lens action to be minimized, so that the aberration is reduced.

Figure 10:
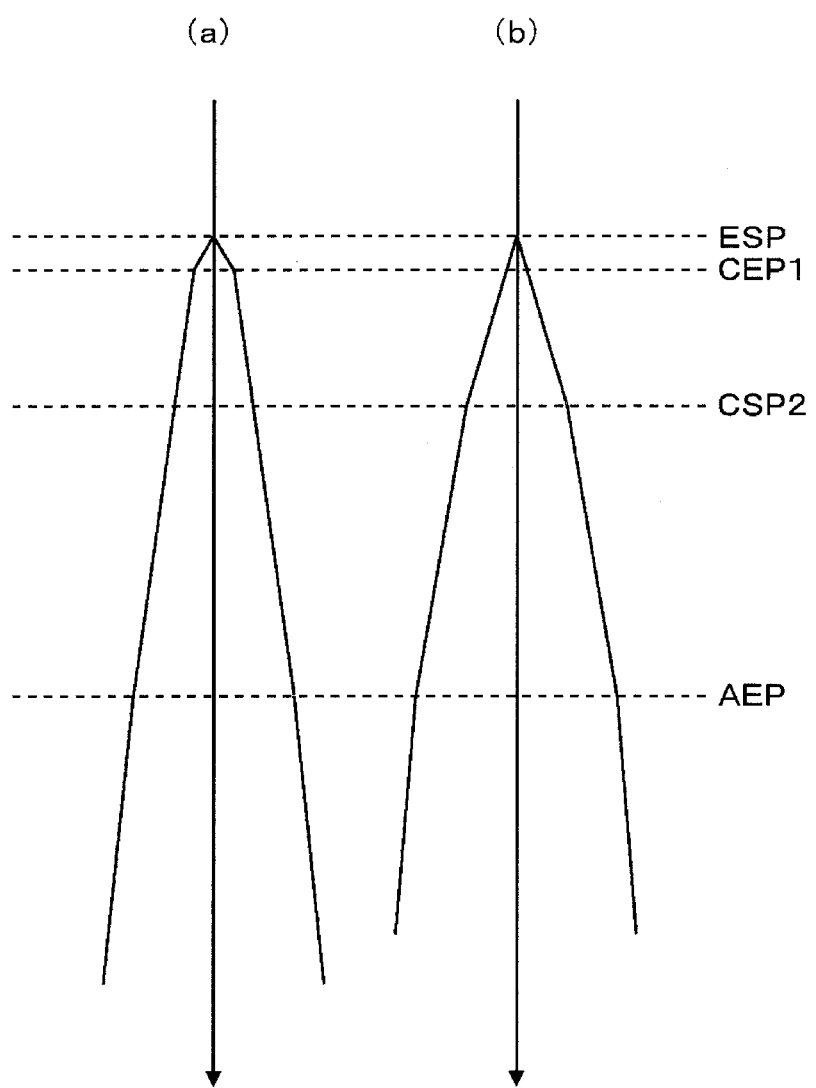
FIG. 10 shows views illustrating electron trajectories drawn by the electron gun.

FIG. 10 illustrates the electron trajectory when two pieces of control electrodes are disposed and the control electrodes to generate the lens action through the acceleration voltage are switched over, in which FIG. 10(*a*) shows the state where the electric field at the tip end with the first control electrode while FIG. 10(*b*) shows the state where the electric field at the tip end is controlled with the second control electrode.

Switching over the control electrodes (first control electrode 91 and second control electrode 92) in use according to the acceleration voltage $V_0$ causes the trajectory of the electron emitted from the electron source 1 to be bent at the control-electrode position in use (first control electrode position (CEP1) or second control electrode position (CEP2)) and the acceleration electrode position (AEP). In this way, using the plurality of control electrodes by switching them over permits the electric field intensity required for drawing an electron to be kept intact and the electrostatic lens action to be minimized so as to make the aberration reduced.

Third Modified Example

Figure 11:
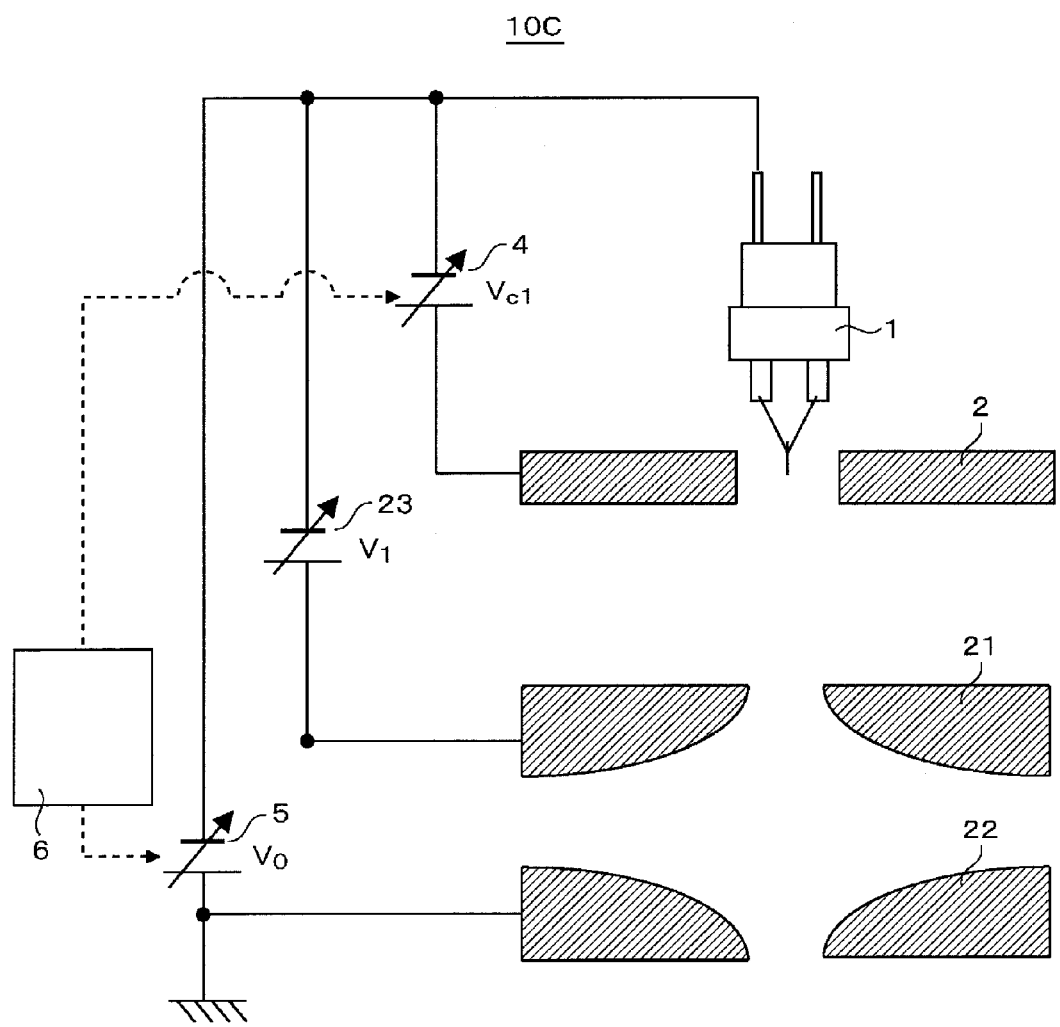
FIG. 11 is a view showing the arrangement of the electron gun according to a third modified example of the present invention.

FIG. 11 is a view showing the arrangement of the electron gun according to the present modified example. With the electron gun 10C according to the present example, in addition to the Butler lens type structure adopted for the electron gun in public domain, the axially symmetrically opposed control electrodes 2 having a wide aperture between them are additionally provided between the drawing electrode 21 of the Butler lens and the electron source 1.

When the electron beam with a lower acceleration or of less than 3 kV, for instance, is gained, the drawing electrode 21 and the acceleration electrode 22 of the Butler lens are placed into the same potential and the acceleration voltage ($V=V_0=V_1$) as desired or required for accelerating the electron is applied to the electrodes. Then, the control voltage ($V_c$) according to the acceleration voltage ($V_0$) is applied to the control electrode 2. In this case, the Butler lens can be regarded as one acceleration electrode, so that the electrostatic lens whose focal length is short is formed in the vicinity of the electron source 1. This leads to reducing the chromatic aberration coefficient. The chromatic aberration which is one of the factors to cause the blurring of the electron beam is in proportion to the chromatic aberration coefficient and in disproportion to the acceleration voltage. In other words, when observation is carried under a lower acceleration voltage, the affect of the chromatic aberration comes to the surface. Since the chromatic aberration coefficient of the electron gun 10C is small, the blurring of the electron beam can be abated even with a lower acceleration.

On the other hand, when the electron beam with a higher acceleration or of 4 kV or higher, for example, is gained, it is controlled by the control section 6 such that the control electrode 2 is placed into the same potential as the electron source 1, in which the electron is drawn with a drawing voltage ($V_1$) applied to the drawing electrode 21 of the Butler lens and the energy of the electron beam is determined with an acceleration voltage ($V_0$) applied to the acceleration electrode 22. The blurring of the electron beam caused by the chromatic aberration is in disproportion to the largeness of the acceleration voltage, so that the present case where the electron beam with a higher acceleration is gained takes advantage of the fact that such chromatic aberration hardly contributes to the resolution of an image.

The advantage brought by the structure of the electron gun 10C lies in the fact that it can be manufactured without changing the structure of the electron gun 20 in public domain so much.

Example 2

Figure 12:
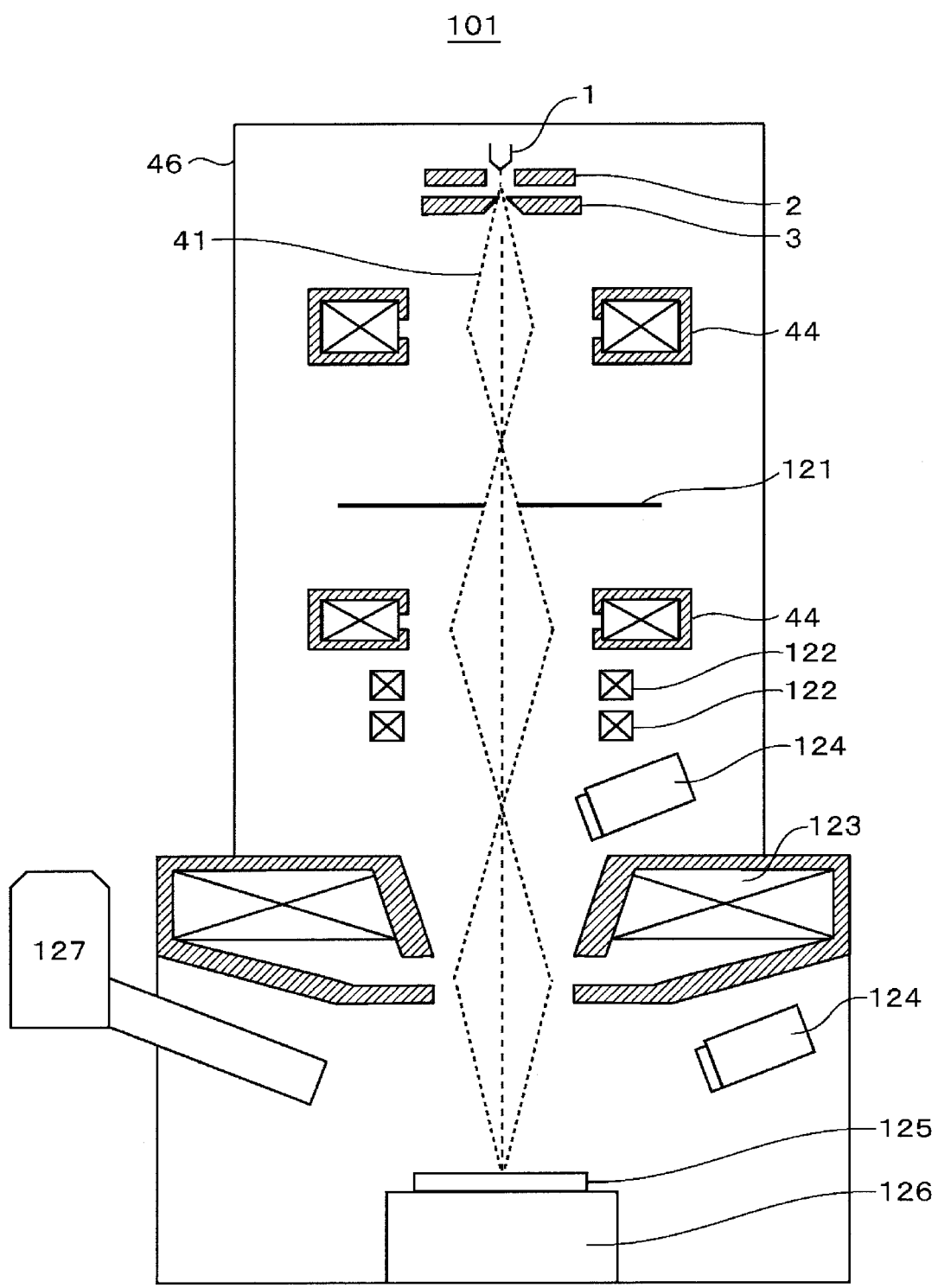
FIG. 12 is a view showing the arrangement of a scanning type electron microscope carrying the electron gun according to the first example of the present invention.

FIG. 12 is a view showing the arrangement where the electron gun according to the first example is carried on the scanning electron microscope. The process in which the electron beam 41 is gained from the electron source 1 in the structure of the electrodes of the electron gun carried on the scanning electron microscope 101 is the same as explained in the first example. After the electron beam 41 emitted from the electron gun is converged with at least one stage of condenser lenses 44 to adjust current applied to a sample 125, it is passed through aperture stops 121 and then irradiated onto a minute area on the sample with focused on such area by objective lenses 123. The electron beam scans the surface of the sample 125 placed on a sample stage 126 through a deflector 122, in which a secondary electron and a reflected electron generated from such surface are detected by a detector 124, thereby, a microscopic image being obtained. Further, a characteristic X-ray generated from the sample onto which the electron beam is irradiated is detected by an X-ray analyzer 127 for element analysis. The condenser lenses 44 and the objective lenses 123 adopted in this process may be either of an electrostatic lens and a magnetic field lens and the deflection system of the deflector 122 may be either of an electrostatic field and a magnetic field.

In order to gain a high resolution image, it requires that the electron beam whose diameter is as small as possible be irradiated onto the sample, but such diameter is affected by the aberration or the larger the aberration is, the larger the diameter (probe diameter) of the electron beam irradiated onto the sample becomes. In the case of an electron microscope employing the electron gun having the conventional structure, it requires that the reduction rate of the optical system formed by the condenser lenses 44, the aperture stops 121 and the objective lenses 123 be enlarged to a great extent to mitigate the contribution of the aberration (especially, chromatic aberration at the time of a lower acceleration) occurring in the electron gun portion to the resolution of an image. The aberration of the electron gun section is reduced or minimized by employing the reduction optical system, but the quantity of current to be irradiated onto the sample is reduced or minimized as well. The quantity of current gives an influence on the S/N ratio and the analytical capability of the microscope.

With the scanning electron microscope 101, the aberration occurring in the electron gun portion can be reduced by one digit. For instance, the chromatic aberration occurring in the electron gun portion and coming to the surface upon observation being carried out with a lower acceleration voltage in the order of 0.1 to 3 kV can be reduced. Accordingly, even when the reduction rate of the optical system formed by the condenser lenses 44, the aperture stops 121 and the objective lenses 123 might be reduced, the probe diameter can be minimized without the detriment of a small diameter of the light source. Thus, a large probe current can be gained along with high resolution imaging with a high luminance of the electron source 1 made the most of.

Moreover, with the scanning electron microscope, generally, observation is carried out with an acceleration voltage changed according to the type of a sample and information to be obtained. When the virtual focal position of the electron source changes to a great extent upon the acceleration voltage being changed, the displacement of the optical axis of the electron beam occurs. When the optical axis is displaced, it causes the resolution imaging of the electron beam to be deteriorated and an irradiation current amount to be reduced, so that it requires that the mechanical position of the electron optical system comprising the condenser lenses, the aperture stops, the objective lenses and so forth arranged subsequently after the electron gun be adjusted or the optical axis be adjusted by e.g. bending the electron trajectory with a coil for alignment. Adjusting the optical axis every time when an acceleration voltage is changed is bothersome and deteriorates the operability and throughput of the microscope.

With the scanning electron microscope 101, the change of the virtual focal position when an acceleration voltage is changed is far smaller than before. Thus, the advantage brought by the same lies in the fact that the adjustment of the optical system is rendered easier or dispensed with upon observation being carried out with an acceleration voltage changed.

Further, on account that the arrangement of the electron gun section according to the present example is very simple, in which only the electrostatic lenses are incorporated, the electron gun can be manufactured advantageously in a compact manner. In addition, the advantages brought by the same lies in the facts that the power sources and so forth required for the electron gun may adopt those used for the conventional electron gun and the scanning electron microscope can be arranged without changing to a great extent the prior arrangement of the electron gun excepting its electrodes section.

In the present example, the electron gun according to the first example is exemplified in use, but any of the electron guns of the first, a second and a third modified examples may be adopted instead.

Example 3

Figure 13:
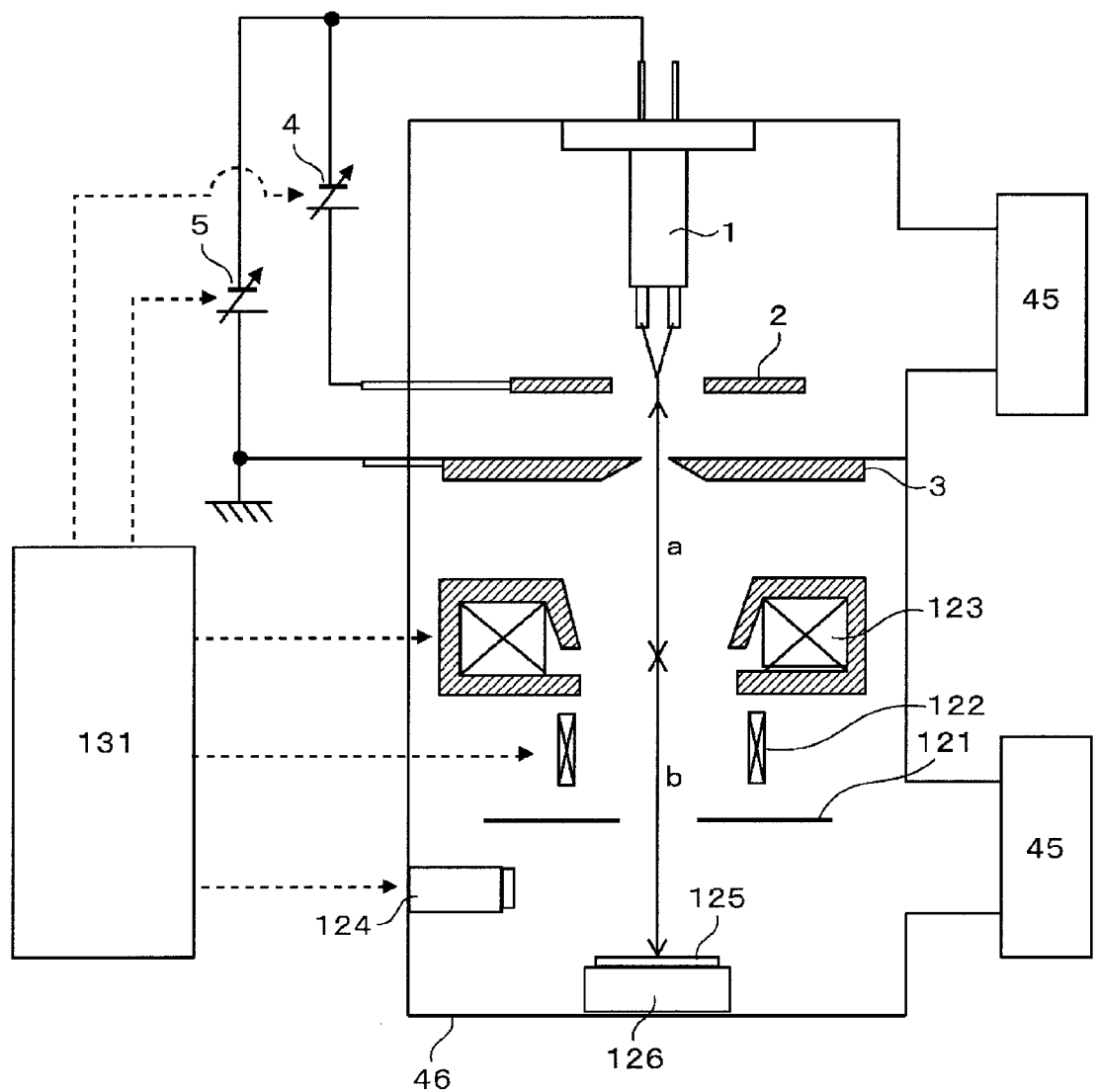
FIG. 13 is a view showing the arrangement of a small-scale scanning type electron microscope carrying the electron gun according to the first example of the present invention.

FIG. 13 is a view showing the arrangement where the electron gun according to the first example is carried on a small-size scanning electron microscope. In order to reduce the size of the apparatus as a whole, the scanning electron microscope 102 hereof corresponds to a scanning electron microscope whose lens pieces are small in number or with the optical system comprising one stage of lenses as shown in FIG. 13, by way of one example. With the scanning electron microscope 102 hereof, after the electron beam emitted from the electron gun is converged with the objective lenses 123 and focused through the aperture stops 121, it is irradiated onto the sample 125. The electron beam scans through the deflector 122 the surface of the sample 125 placed on the sample stage 126, in which a secondary electron and a reflected electron generated from such surface is detected by the detector 124, thereby, a microscopic image being obtained. The objective lens 123 adopted herein may be either of an electrostatic lens and a magnetic field lens.

By means of a control unit 131, a voltage applied to the acceleration electrode 3 is controlled such that the electron beam with an energy as desired is gained and at the same time a voltage applied to the control electrode 2 is controlled such that the electric field applied at the tip end of the emitter of the electron source 1 is rendered optimum. As for the adjustment of observation magnification and the focal position, it is carried out by adjusting the intensity of the magnetic field or electric field generated by the objective lenses by means of the control unit 131. The scanning speed of the electron beam with regard to the sample through the deflector 122 is also controlled by the control unit 131.

Adopting the electron gun according to the first example herein allows the aberration of the electron gun portion to be further reduced than before, in which high current and high resolution imaging is realized even with the reduction rate of the electron optical system as a whole minimized. In other words, it permits the distance (a) from the tip end of the electron source to the main surface of the lens to be the same as or shorter than the distance (b) from the main surface of the lens to the sample. This allows the structure from the electron source to the lenses to be arranged in a compact manner. It is preferred that the distance (a) from the electron gun portion to the main surface of the objective lenses be 20 to 100 mm or it is more preferable that such distance be 20 to 50 mm. It is also preferred that the distance (b) from the main surface of the objective lenses to the sample be 100 mm or shorter or it is more preferable that such distance be 50 mm or shorter. In addition, the outer diameter of the electron gun and the objective lens is defined as 20 to 200 mm herein.

Then, in order to carry out observation in which the performance of the scanning electron microscope is maximized, it requires that the optical axis of the electron beam generated from the electron gun be in alignment with the center axis of the lenses. If the optical axis is not in alignment with the center axis, it leads to deteriorating the resolution of imaging and the quantity of current. Thus, generally, it requires that the positions of the electron gun, the lenses and the aperture stops be mechanically adjusted or the optical axis be adjusted by e.g. bending the trajectory of the electron beam with a coil and as such for alignment in use. Adopting the electron gun according to the first example herein allows high resolution of imaging to be achieved even in the electron optical system whose reduction rate is small. This brings the advantage of making it possible to reduce the number of lens pieces like the scanning electron microscope 102 according to the present example or it can be arranged with just one piece of lens, by way of one example, so that the axial alignment of the electron optical system as a whole is facilitated. This permits the operability of the microscope upon observation and throughput thereof to improve.

Further, with the scanning electron microscope 102, the change of the virtual focal position when an acceleration voltage is changed is far smaller than before. Thus, the advantage brought by the same lies in the fact that the adjustment of the optical system is rendered easier upon observation being carried out with an acceleration voltage changed.

Moreover, the arrangement of the electron gun portion according to the present example is very simple, in which only electrostatic lenses are employed, so that it can be manufactured in a compact manner, which is advantageous when it is used for a small-scale electron beam apparatus.

In the present example, the electron gun according to the first example is exemplified in use, but any of the electron guns of the first, second and third modified examples may be adopted instead.

In the second and third examples, the explanations are centered on the scanning electron microscope, but any of the electron guns according to the first example, the first, second and third modified examples (hereinafter, simply referred to as 'first example') can be adopted for the electron source of a transmission electron microscope, a scanning transmission electron microscope and that of the other electron beam application apparatuses employing such beam.

When the electron gun according to the first example is adopted for the electron source of any one of the electron beam application apparatuses, the luminance of the electron beam can be enhanced even under high current due to the fact that the aberration coefficient of its electron gun portion is smaller than that of the conventional electron gun. Further, the change of the virtual focal position against the acceleration voltage is small, so that the axial alignment upon the acceleration voltage being changed is advantageously facilitated.

Example 4

The structure of the electrodes according to the first example is applicable not only to the electron beam apparatuses, but also to the other charged particle beam apparatuses. For instance, when the electron source is replaced with an ion source, a charged particle beam apparatus with the same arrangement as the electron beam apparatus is feasible by changing the high-voltage polarity.

Figure 14:
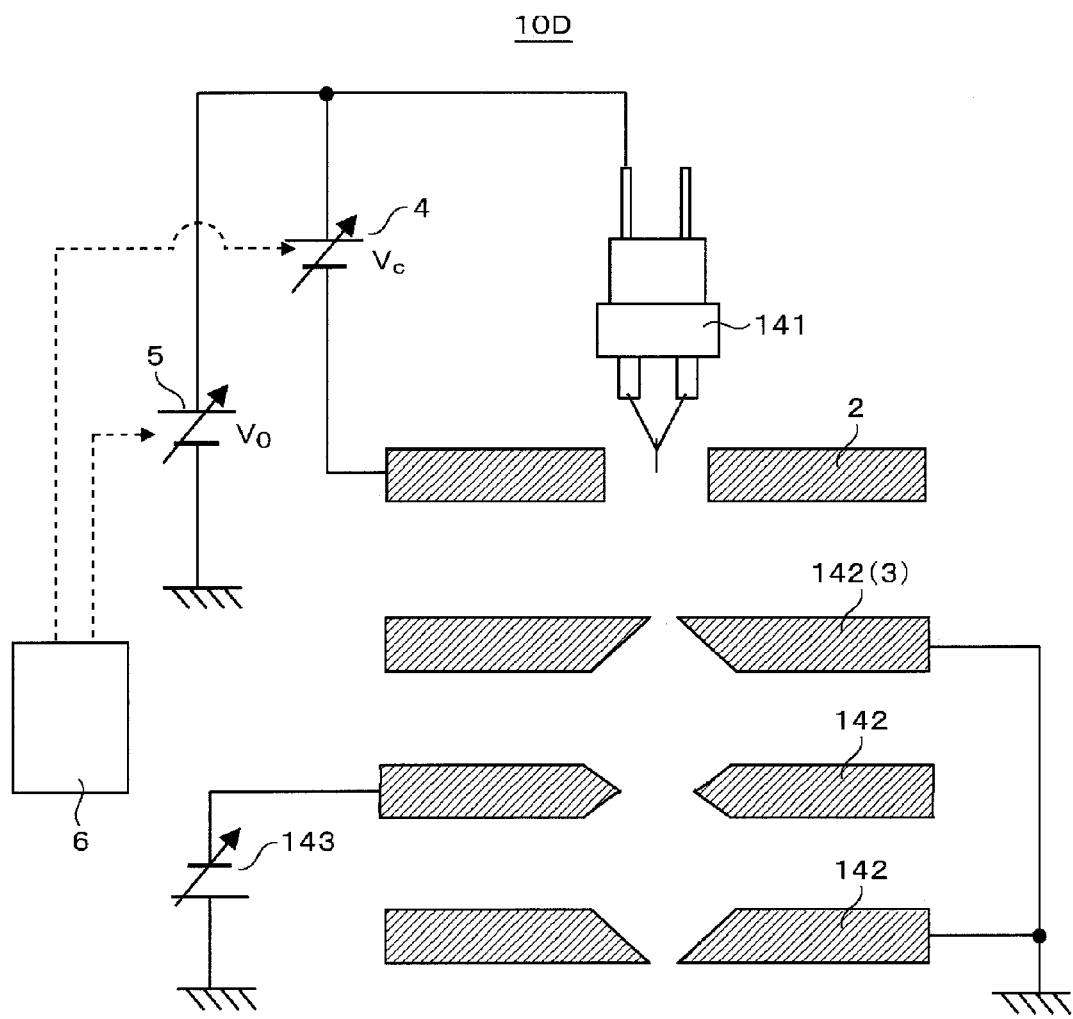
FIG. 14 is a view showing the arrangement of an ion gun according to a fourth example of the present invention.

FIG. 14 is a view showing the arrangement of an ion gun according to the present example. The ion gun 10D according to the present example adopts the electrodes structure according to the first example. When an ion beam with an energy as desired is gained from the tip end of an ion source 141, the negative voltage required for the acceleration power source 5 is controlled by the control section 6 and applied to the power source. At this time, due to the fact that a potential difference arises between the tip end of the ion source 141 and the acceleration electrode 3 so that an electric field is applied at the tip end of the ion source 141, the control electrode power source 4 is controlled by the control section 6 such that a control voltage sufficient enough to generate an electric field intensity optimum for drawing an ion from the ion source 141 is applied to the control electrode 2, thereby, an ion beam with an energy as desired being gained. The drawn ion beam is focused by a condenser electrode 142 and then introduced into the subsequent optical system. The condenser electrode 142 corresponds to an einzel lens comprising three stages of electrodes, in which the first and third stages are placed into the same potential, so that the ion beam can be focused without changing the energy thereof.

When it is desired that an ion beam with a lower acceleration is gained or especially when the ion gun is used under the condition expressed with $|V_c|<|V_0|$, after an ion is drawn from the ion source, it is decelerated between the control electrode 2 and the acceleration electrode 3. In general, using the electrostatic lens under the condition that the charged particle is decelerated leads to enlarging the aberration coefficient. However, adopting the electrodes structure of the ion gun 10D allows the acceleration electrode to be disposed nearer to the charged particle source than before, which makes the focal length of the electrostatic lenses shorter, thereby, the aberration coefficient being reduced. Especially, the chromatic aberration coming to the surface when an ion beam with a lower acceleration is used can be reduced, so that the beam diameter upon observation, analysis and machining being carried out employing anion beam can be advantageously minimized.

Figure 15:
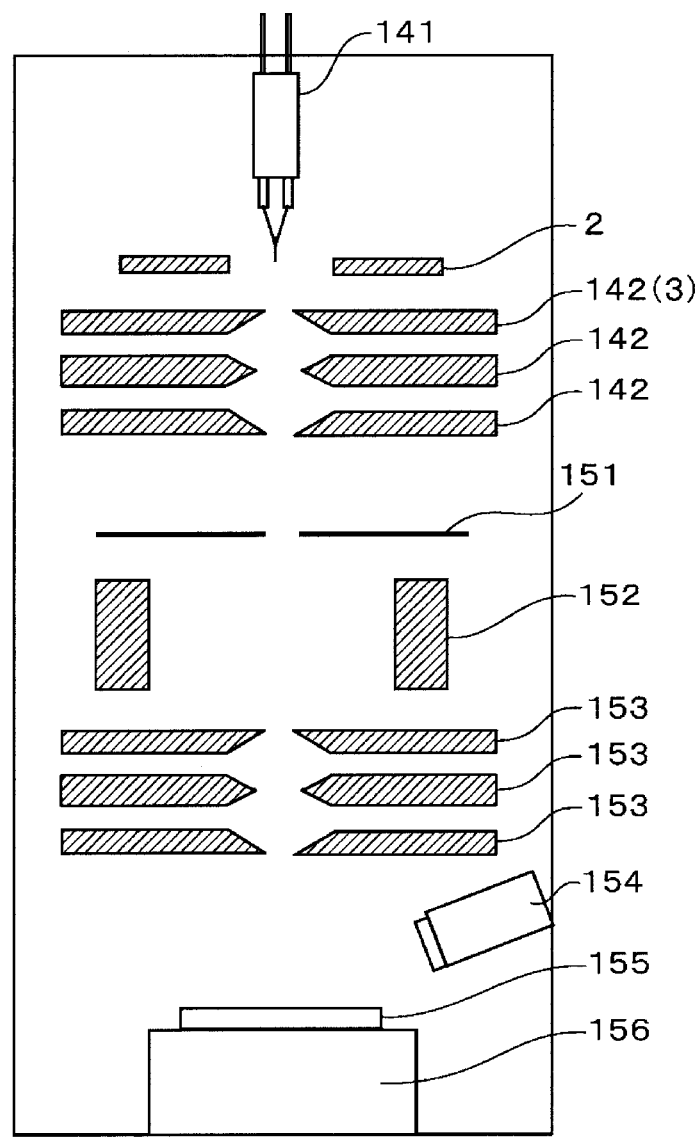
FIG. 15 is a view showing the arrangement of a scanning ion microscope carrying the ion gun according to the fourth example of the present invention.

FIG. 15 is a schematic view showing the scanning ion microscope on which an ion gun according to the present example is carried. With the scanning ion microscope 103 hereof, after the ion beam drawn from the ion source 141 through the electric field formed by the acceleration electrodes 3 and the control electrodes 2 is focused by the condenser electrodes 142 and the extra beam is removed therefrom by aperture stops 151, it is irradiated onto a minute area on the sample 155 with focused on such area through the objective lenses 153. The ion beam scans the surface of the sample 155 placed on the sample stage 156 through the deflector 152, in which a secondary particle generated from such surface is detected by the detector 154, thereby, a microscopic image being obtained. Adopting the electrodes structure of the ion gun 10D allows the aberration occurring in the ion gun portion to be abated and permits the chromatic aberration coming to the surface especially upon the ion beam with a lower acceleration being used to be reduced, so that the beam can be focused much narrower at the time of observation at a lower acceleration so as to make the resolution of imaging improve. In general, using the beam with a lower acceleration allows the surface of the sample to be observed further in details without damaging the sample.

The ion gun according to the present example is applicable not only to the scanning ion microscope, but also to the other charged particle beam apparatuses including a transmission ion microscope and an ion beam machining apparatus.

In the foregoing descriptions, the present invention is concretely explained based on the mode for carrying out the same, examples and modified examples. However, the present invention is not limited to such mode for carrying out the same, such examples and modified examples, but may be modified into various manners within the technical scope thereof.

REFERENCE SIGNS LIST

1: electron source,
2: control electrode,
3: acceleration electrode,
4: control electrode power source,
5: acceleration power source,
6: control section,
7: positional adjustment mechanism, 10, 10A, 10B and 10C: electron gun,
10D: ion gun,
20: Butler lens type electron gun,
21: Butler lens drawing electrode,
22: Butler lens acceleration electrode,
23: drawing power source,
41: electron beam,
42: electron impingement degassing,
43: differential exhaust aperture stop,
44: condenser lens,
45: vacuum pump,
46: housing,
91: first control electrode,
92: second control electrode,
93: first control electrode power source,
94: second control electrode power source,
100: electron microscope,
101: scanning electron microscope,
102: small-scale scanning electron microscope,
103: scanning ion microscope,
121: aperture stop,
122: deflection coil,
123: objective lens,
124: detector,
125: sample,
126: sample stage,
131: control unit,
141: ion source,
142: condenser electrode,
143: condenser power source,
151: aperture stop,
152: deflector,
153: objective lens,
154: secondary particle detector,
155: sample,
156: sample stage,
200: charged particle apparatus,
201: charged particle source,
202: control electrode,
203: acceleration electrode,
204 and 205: power source,
206: control section.

The invention claimed is:

1. An electron gun comprising:
a needle-like electron source acting as a field emission type electron source; an acceleration electrode to accelerate an electron emitted from the electron source;
a control electrode disposed nearer to a side of the electron source than to a side of the acceleration electrode and having an aperture diameter larger than an aperture diameter of the acceleration electrode; and
a control section to control a potential applied to the control electrode based on a potential applied to the acceleration electrode.

2. The electron gun according to claim 1, wherein provided that the aperture diameter of the acceleration electrode is defined as D and a distance between the electron source and the acceleration electrode is defined as L, a fraction of D to L is expressed with D/L<1.

3. The electron gun according to claim 2, wherein the distance between the electron source and the acceleration electrode is defined as 6 mm<L<20 mm.

4. The electron gun according to claim 1, wherein the electron gun is of Cold (Cathode) Field Emission (CFE) type.

5. The electron gun according to claim 3, wherein the electron gun is provided with two or more pieces of control electrodes.

6. The electron gun according to claim 3, wherein a drawing electrode is provided between the acceleration electrode and the control electrode.

7. The electron gun according to claim 5, wherein the electron gun is provided with a control mechanism to switch over electrodes in use according to an acceleration voltage of the electron.

8. A charged particle beam apparatus employing the electron gun according to claim 1, the apparatus comprising at least one or more pieces of one of electrostatic and magnetic field lenses; a sample stage on which an observation sample is placed; and a detector to detect at least one of a reflected electron and a secondary electron, wherein the sample is observed or analyzed by the electron beam.

9. The charged particle beam apparatus according to claim 8 provided with an electron optical system employing one piece of one of electrostatic and magnetic field lenses.

10. The charged particle beam apparatus according to claim 8, wherein an outer diameter size of one of the electron gun and an objective lens is 200 mm or smaller.

11. The charged particle beam apparatus according to claim 8 provided with a function to observe the sample employing the electron beam with a lower acceleration, in which the acceleration voltage of the electron ranges from 0.1 to 3 kV.

12. A charged particle gun comprising:
a charged particle source; an acceleration electrode to accelerate a charged particle emitted from the charged particle source;
a control electrode disposed nearer to a side of the charged particle source than to a side of the acceleration electrode and having a larger aperture diameter than an aperture diameter of the acceleration electrode; and
a control section to control a potential applied to the control electrode based on a potential applied to the acceleration electrode.

13. A charged particle beam apparatus employing the charged particle gun according to claim 12, the apparatus comprising:
a sample stage on which an observation sample is placed;
an objective lens to focus and irradiate the charged particle beam onto the sample; and
a detector to detect a secondary electron,
wherein the sample is observed or analyzed by the charged particle beam.

14. The charged particle beam apparatus according to claim 13, wherein the charged particle drawn from the charged particle source are decelerated for use.

15. A charged particle gun comprising:
a charged particle source;
an acceleration electrode to accelerate a charged particle emitted from the charged particle source;
a control electrode disposed nearer to a side of the charged particle source than to a side of the acceleration electrode; and
a control section to control a potential applied to the control electrode based on a potential applied to the acceleration electrode, wherein the control section applies a control voltage to enhance an electric field at a tip end of the charged particle source to the control electrode when an acceleration voltage of the acceleration electrode is low whereas applying a control voltage to suppress the electric field at the tip end of the charged particle source to the control electrode when the acceleration voltage is high.

* * * * *